United States Patent
Watanabe

(10) Patent No.: US 7,786,515 B2
(45) Date of Patent: Aug. 31, 2010

(54) SOLID-STATE IMAGING DEVICE AND METHOD OF MANUFACTURING THE SAME

(75) Inventor: Shinya Watanabe, Nagasaki (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/324,862

(22) Filed: Jan. 4, 2006

(65) Prior Publication Data

US 2006/0151812 A1    Jul. 13, 2006

(30) Foreign Application Priority Data

Jan. 7, 2005    (JP)    ............... P2005-002772

(51) Int. Cl.
    *H01L 31/062*    (2006.01)
(52) U.S. Cl. ............... 257/222; 257/291; 257/294
(58) Field of Classification Search ............ 257/222, 257/239, E27.13, 291, 294
    See application file for complete search history.

(56) References Cited

U.S. PATENT DOCUMENTS

| | | | | |
|---|---|---|---|---|
| 5,654,565 | A * | 8/1997 | Hokari | ............... 257/222 |
| 6,335,911 | B1 | 1/2002 | Kuroda | |
| 6,348,361 | B1 * | 2/2002 | Lee et al. | ............... 438/70 |
| 6,362,498 | B2 * | 3/2002 | Abramovich | ............... 257/233 |
| 6,809,359 | B2 * | 10/2004 | Yamada | ............... 257/292 |
| 6,861,686 | B2 * | 3/2005 | Lee et al. | ............... 257/291 |
| 7,101,727 | B2 * | 9/2006 | Rhodes | ............... 438/70 |
| 7,420,231 | B2 * | 9/2008 | Maruyama | ............... 257/233 |
| 2004/0000669 | A1 | 1/2004 | Yamamura | |
| 2005/0012166 | A1 * | 1/2005 | Choi | ............... 257/414 |
| 2006/0113622 | A1 * | 6/2006 | Adkisson et al. | ............... 257/443 |

FOREIGN PATENT DOCUMENTS

| | | |
|---|---|---|
| JP | 2001-189443 | 7/2001 |
| JP | 2002-141314 | 5/2002 |
| JP | 2003-324189 | 11/2003 |
| JP | 2004-221527 | 8/2004 |

OTHER PUBLICATIONS

A Japanese Office Action dated Nov. 11, 2008 issued in connection with counterpart Japanese Patent Application No. 2005-002772.

* cited by examiner

*Primary Examiner*—Eugene Lee
(74) *Attorney, Agent, or Firm*—Sonnenschein Nath & Rosenthal LLP

(57) ABSTRACT

A solid-state imaging device including: a semiconductor substrate on which an imaging region having a light receiving section is formed; and a predetermined layer formed on the semiconductor substrate by planarization processing using liquid containing a metal element, wherein at least a first diffusion protection film is formed between the light receiving section and the predetermined layer.

19 Claims, 6 Drawing Sheets

SOLID-STATE IMAGING DEVICE AND METHOD OF MANUFACTURING THE SAME

BACKGROUND OF THE INVENTION

1. Field of the Invention

The present invention relates to a solid-state imaging device and a method of manufacturing a solid-state imaging device. More particularly, the present invention relates to a solid-state imaging device which suppresses diffusion of residual metal elements remained due to planarization processing being performed and suppresses deterioration of sensitivity or an image quality, and a method of manufacturing the solid-state imaging device.

2. Description of Related Art

In recent years, in order to meet the demands for reducing the size and weight and for lowering power consumption for products in which a solid-state imaging device is used, a processing circuit which has been provided in a signal processing device is to be formed in the periphery of a light receiving section of a solid-state imaging device. As a result, a single solid-state imaging device is enabled to perform all processing and the signal processing device is no longer required.

As such a solid-state imaging device, a complementary metal oxide semiconductor (CMOS) solid-state imaging device is particularly known to have advantages for reducing the size and weight as well as the cost, and further, for lowering power consumption. The CMOS solid-state imaging device is formed by providing a peripheral circuit made of a required circuit, in the periphery of a light receiving section in which a photoelectric conversion element having a CMOS structure is formed.

With the progresses of micro-fabrication techniques of a MOS process, it becomes possible easily to have a photoelectric conversion element be miniaturized with higher number of pixels and to have a peripheral circuit be highly integrated. Accordingly, the solid-state imaging device is more and more improved to reduce the size and to have higher number of pixels and higher functions.

As one of the recent micro-fabrication techniques, there has been proposed, for example, a technique of using copper wiring for wiring in a device, in place of related art aluminium wiring. More specifically, because copper has a resistance value lower than that of aluminium and is possible to make a wiring pitch small and a wiring thickness thin, the use of the copper wiring is proposed as one of the miniaturizing techniques. However, since an etching for copper has not been established yet, a dual damascene technique is presently employed, in which a wiring groove is formed and filled with conductive materials such as metals (for example, copper) and then polished by a chemical mechanical polishing (CMP) method to form wiring and a connection section at the same time (for example, refer to Japanese Patent Application Publication No. 2003-324189).

On the other hand, there still remains an issue of mounting multi-functional circuits on the solid-state imaging device without sacrificing the image quality performance as an imaging device.

As an imaging device, the solid-state imaging device is required to suppress the deterioration (for example, so-called up-shift output values due to dark currents) of the image quality of reproduced images. In the case where copper is used as a material for the wiring, if copper leaks from the copper wiring and diffuses into an interlayer insulation film and a silicon substrate and then reaches a light receiving section of a photoelectric conversion element, the diffused copper behaves as impurity contamination to cause deterioration of the image quality such as increasing dark currents (so-called white spots). Accordingly, in order to suppress factors which cause deterioration of the image quality and a threshold shifting of MOS transistors of peripheral circuits, it is necessary to form a diffusion protection film so as to cover the upper surface of the copper wiring after the copper wiring is formed by the dual damascene.

A method of manufacturing the CMOS solid-state imaging device in which the copper wiring is formed by the dual damascene will be described below with reference to the drawings.

In the method of manufacturing the CMOS solid-state imaging device in which the copper wiring is formed by the dual damascene, as shown in FIG. 5A, first, an element isolation film 102 is formed on an N-type silicon substrate 101 by shallow trench isolation (STI). In addition, a well region (not shown) is formed, and phosphorus (P), arsenic (As), boron (B), boron difluoride (BF2), which are impurities, are selectively filled into a region to be an N-type MOS transistor or a P-type MOS transistor, and next, a gate oxide film 103 of a transistor is formed by thermal oxidation, after that, a gate electrode 104 of a transistor is formed.

Next, a sidewall 105 and a high concentration diffusion layer region 106 having an lightly doped drain (LDD) structure are formed by ion implantation and heat treatment, and a light receiving section 107 is formed by filling with impurities.

Further, a silicon nitride film 108 serving as a stopper layer is formed on a surface of the silicon substrate 101 by low-pressure chemical vapor deposition (LPCVD). In order to improve defects of white spots and to progress a driving performance of the MOS transistor, an opening 150 is formed on a part of the silicon nitride film 108 by general-purpose photolithography and etching. After that, an interlayer insulation film 109 is formed on the silicon nitride film 108 (refer to FIG. 5A).

Next, as shown in FIG. 5B, a first connection hole for connecting the high concentration diffusion layer region 106 and a first wiring layer which is described later is formed in the silicon nitride film 108 and the interlayer insulation film 109. After filling the first connection hole with a barrier metal layer 110A containing tantalum nitride and a tungsten electrode layer 110B, polishing is performed on the first connection hole by the CMP to form a first connection section 110.

In addition, a first inter-wiring insulation film 111 is formed and processed by general-purpose photolithography and etching to form a first wiring groove in a region to be copper wiring which is described later. A barrier metal 112A and copper 112B are filled in the first wiring groove and the surplus copper and the surplus barrier metal are polished and removed by the CMP to form a first wiring layer 112. Further, a first diffusion protection film (for example, a silicon carbide film) 113 is formed on the first wiring layer 112 to protect the copper wiring (refer to FIG. 5B).

As shown in FIG. 5C, a second inter-wiring insulation film 114 is formed on the first diffusion protection film 113, and a region to be a second connection section and a second wiring layer is processed by general-purpose photolithography and etching and filled with barrier metals 115A and 116A and copper 115B and 116B, and then the surplus copper and the surplus barrier metal are polished and removed by the CMP to form a second connection section 115 and a second wiring layer 116. Further, a second diffusion protection film (for example, a silicon carbide film) 117 is formed on the second wiring layer 116 to protect the copper wiring (refer to FIG. 5C).

After that, a color resist 118 and an on-chip lens 119 are formed thereon, and thus the CMOS solid-state imaging device can be obtained (refer to FIG. 5D).

It is to be noted that, in the CMOS solid-state imaging device shown in FIGS. 5A to 5D, since layers having different refractive indexes and absorption indexes are stacked on the light receiving section 107, it may cause the deterioration of a light receiving efficiency to the photoelectric conversion element due to attenuation or interference of light. In order to address it, a technique has recently been proposed which opens a diffusion protection film at a predetermined range on the upper region of a photoelectric conversion element.

In other words, according to the proposed technique, by selectively opening the upper region of the light receiving section of the photoelectric conversion element, deterioration of the light receiving efficiency due to attenuation or interference of light is suppressed and light is allowed to enter into the light receiving section favorably, even materials having different refractive indexes and different absorption indexes for the light transmitted are used to make the diffusion protection film, which is provided to protect diffusion from materials used for the wiring.

Specifically, after the diffusion protection film 117 is formed to protect the copper wiring in the second wiring layer as shown in FIG. 5C, the light receiving region of the photoelectric conversion element is opened by general-purpose photography and etching to form an opening region 120A. Sequentially, the opening region 120A is filled with a CVD oxide film 121 and polished by the CMP to remove the surplus CVD oxide film 121, thereby forming an opening 120 of the upper region of the light receiving section of the photoelectric conversion element (refer to FIG. 6A). After that, a color resist 118 and an on-chip lens 119 are formed thereon, and thus the CMOS solid-state imaging device can be obtained (refer to FIG. 6B).

SUMMARY OF THE INVENTION

However, in the related art CMOS imaging device mentioned above, since the diffusion protection films (the first diffusion protection film 113 and the second diffusion protection film 117) are formed on the wiring layers (the first wiring layer 112 and the second wiring layer 116), diffusion of copper which is a material for wiring can be suppressed, however diffusion of potassium is difficult to avoid, which is contained in a slurry (potassium hydroxide basis) used in the CMP processing to form the wiring layer.

More specifically, when copper and a barrier metal, which are materials for wiring, are polished by the CMP using a slurry serving as polishing agent, potassium contained in the slurry with a high proportion is remained between the first inter-wiring insulation film 111 and the first diffusion protection film 113 and between the second inter-wiring insulation film 114 and the second diffusion protection film 117, and then this potassium diffuses into the oxide films and a silicon substrate.

When the diffused potassium reaches the light receiving section of the photoelectric conversion element, the diffused potassium causes deterioration of the image quality such as white spots and the like, as impurity contaminant.

Although it may be conceivable that the slurry is to be removed after the CMP processing, if the slurry is removed by using HF added pure water generally used in the CMP for oxide films, copper and barrier metal, which are materials for wiring, are also dissolved, thereby causing physical defects and adversely affecting to various characteristics of wiring. Accordingly, in the present CMP technique for the copper wiring, the elimination of slurry with HF added pure water and the like does not performed after polishing, so that it is believed that a considerable amount of potassium is remained on the surface of the layer polished, at the time of completion of the CMP polishing.

The present invention is made in view of the above-mentioned circumstances and is to provide a solid-state imaging device capable of suppressing diffusion of residual metal elements remained due to planarization processing being performed and of suppressing deterioration of the sensitivity and an image quality, and a method of manufacturing such solid-state imaging device.

In order to achieve the above-mentioned demands, a solid-state imaging device according to an embodiment of the present invention includes: a semiconductor substrate on which an imaging region having a light receiving section is formed; and a predetermined layer formed on the semiconductor substrate by planarization processing using liquid containing a metal element, wherein at least a first diffusion protection film is formed between the light receiving section and the predetermined layer.

The metal element contained in the liquid being used during planarization processing may remain. However, by virtue of forming at least the first diffusion protection film between the light receiving section and the predetermined layer, diffusion of the residual metal element into the semiconductor substrate side can be suppressed.

Further, in order to achieve the above-mentioned demands, a method of manufacturing a solid-state imaging device includes the steps of: forming an imaging region having a light receiving section on a semiconductor substrate; forming a first diffusion protection film on the semiconductor substrate; and performing planarization processing on a predetermined layer formed on the first diffusion protection layer by using liquid containing a metal element.

The metal element contained in the liquid being used during planarization processing to the predetermined layer formed on the first may remain. However, by virtue of forming the first diffusion protection film on the semiconductor substrate, diffusion of the residual metal element into the semiconductor substrate side can be suppressed.

In the solid-state imaging device and the method of manufacturing the solid-state imaging device according to the present invention, it is possible to suppress diffusion into the semiconductor substrate of the residual metal elements remained due to planarization processing being performed, and possible to lower the deterioration of the sensitivity and the image quality.

DESCRIPTION OF THE EMBODIMENT(S)

Embodiments of the present invention will be described below to understand the present invention, with reference to drawings.

Figure 1:
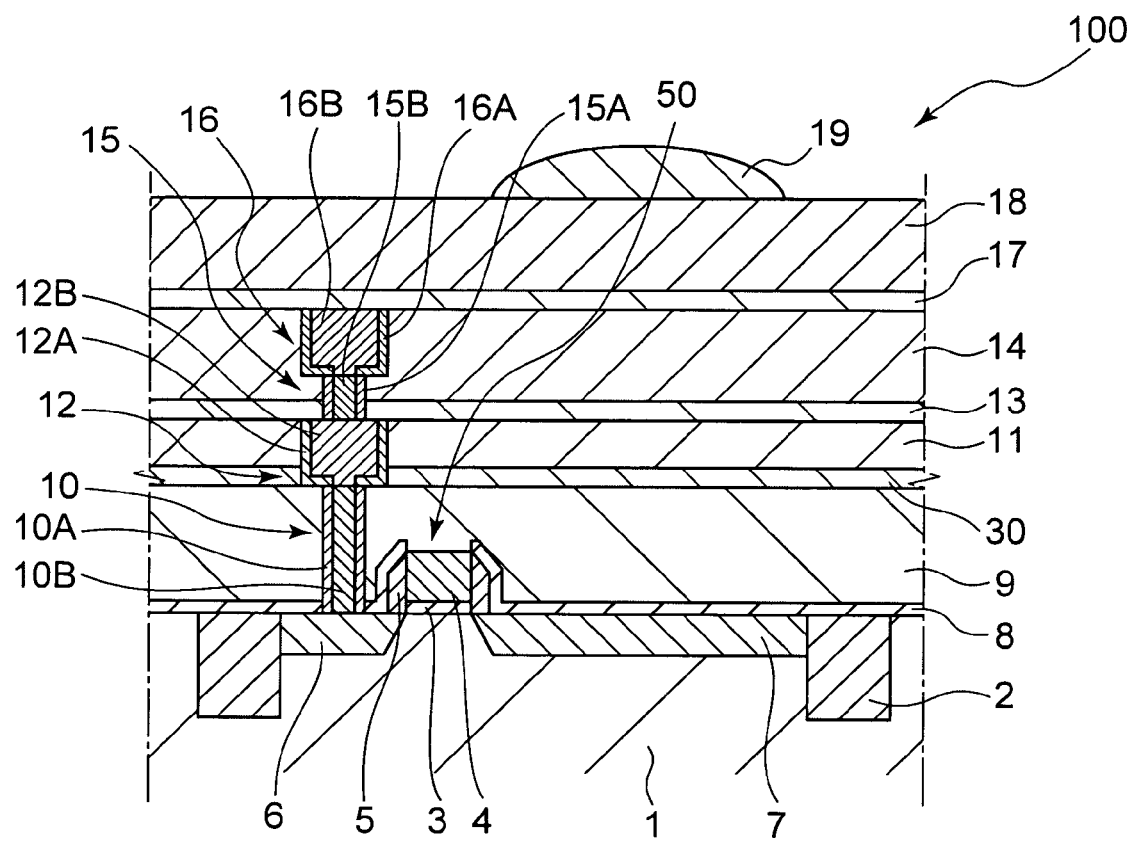
FIG. 1 is a schematic cross-sectional view illustrating a CMOS solid-state imaging device which is one example of a solid-state imaging device to which an embodiment of the present invention is applied.

FIG. 1 is a cross-sectional view illustrating a CMOS solid-state imaging device which is one example of a solid-state imaging device to which an embodiment of the present invention is applied.

In a CMOS solid-state imaging device 100 shown in FIG. 1, on an N-type silicon substrate 1 on which an element isolation film 2 is formed together with a high concentration diffusion layer region 6 having an LDD structure and a light receiving section 7, a gate oxide film 3 of a transistor and a gate electrode 4 of a transistor and a side wall 5 are formed.

In addition, on the N-type silicon substrate 1, a silicon nitride film 8 having an opening 50, an interlayer insulation film 9, a first diffusion protection film 30, a first inter-wiring insulation film 11, a second diffusion protection film 13, a second inter-wiring insulation film 14, a third diffusion protection film 17 and a color resist 18 are formed in this order. In addition, an on-chip lens 19 is provided on a light receiving region of the color resist 18.

Further, a first connection section 10 electrically connected to the high concentration diffusion region 6 is formed in the silicon nitride film 8 and the interlayer insulation film 9, a first wiring layer 12 electrically connected to the first connection section 10 is formed in the first diffusion protection film 30 and the first inter-wiring insulation film 11, a second connection section 15 electrically connected to the first wiring layer 12 and a second wiring layer 16 electrically connected to the second connection section 15 are formed in the second diffusion protection film 13 and the second inter-wiring insulation film 14.

A method of manufacturing the CMOS solid-state imaging device configured in the above manner will be described below. More specifically, one example of a method of manufacturing a solid-state imaging device to which an embodiment of the present invention is applied will be described.

Figure 2A:
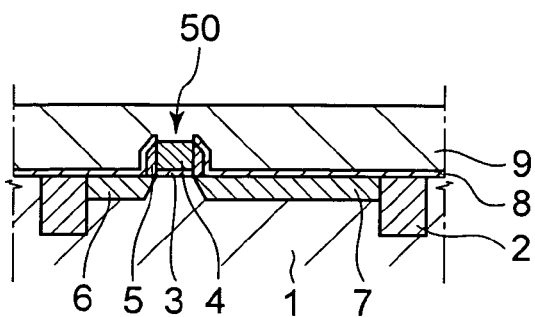
FIGS. 2A to 2D are schematic cross-sectional views illustrating a method of manufacturing a solid-state imaging device to which an embodiment of the present invention is applied.

In the method of manufacturing the solid-state imaging device to which an embodiment of the present invention is applied, first, as shown in FIG. 2A, the element isolation film 2 is formed on the N-type silicon substrate 1 by STI. A well region (not shown) is formed and selectively filled with impurities which are phosphorus (P), arsenic (As), boron (B) and boron difluoride (BF2) to become an N-type MOS transistor or a P-type MOS transistor, and the gate oxide film 3 of a transistor is formed by thermal oxidation, and then the gate electrode 4 of a transistor is formed.

Next, the side wall 5 and the high concentration diffusion layer region 6 having an LDD structure are formed by ion implantation and heat treatment, and the light receiving section 7 is formed by filling with impurities.

The silicon nitride film 8 serving as a stopper layer is formed on the surface of the silicon substrate 1 by LPCVD and the opening 50 is formed on a part of the silicon nitride film 8 by general-purpose photography and etching. After that, the interlayer insulation film 9 is formed on the silicon nitride film 8 (refer to FIG. 2A).

Figure 2B:
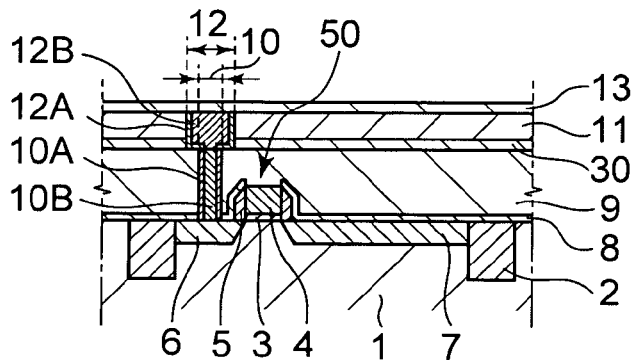

Next, as shown in FIG. 2B, the first connection hole is opened to connect the high concentration diffusion layer region 6 and the first wiring layer 12 which will be described later. After the first connection hole is filled with a barrier metal layer 10A containing tantalum nitride and a tungsten electrode layer 10B, the first connection hole is polished by the CMP, thereby forming the first connection section 10. A silicon nitride film is subsequently formed as the first diffusion protection film 30 on the interlayer insulation film 9 by chemical vapor deposition (CVD).

The first inter-wiring insulation film 11 is formed on the first diffusion protection film 30. The first inter-wiring insulation film 11 and the first diffusion protection film 30 are processed by general-purpose photography and etching to open the first wiring groove on the region to become the copper wiring which will be described later. A barrier metal 12A and copper 12B are filled in the first wiring groove, the surplus copper and the surplus barrier metal are polished by the CMP, thereby forming the first wiring layer 12. The second diffusion protection film (for example, a silicon carbide film) 13 is further formed on the first wiring layer 12 to protect the copper wiring (refer to FIG. 2B).

Figure 2C:
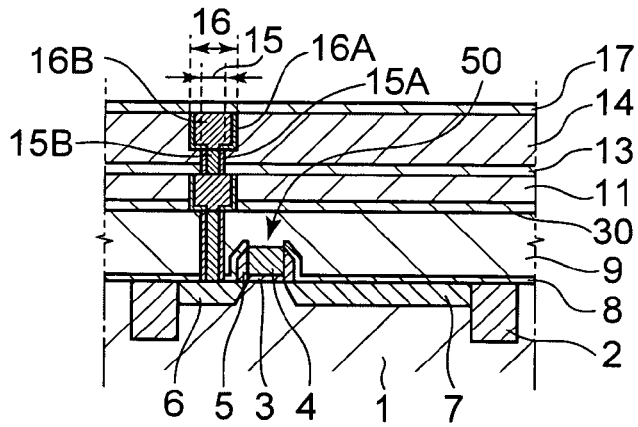

As shown in FIG. 2C, the second inter-wiring insulation film 14 is formed on the second diffusion protection film 13. A region of the second inter-wiring insulation film 14 to become the second connection section 15 and the second wiring layer 16 is processed by general-purpose photolithography and etching and filled with the barrier metal 15A and 16A and the copper 15B and 16B, and then the surplus copper and the surplus barrier metal are polished by the CMP to form the second wiring layer 16. The third diffusion protection film (for example, a silicon carbide film) 17 is further formed on the second wiring layer 16 to protect the copper wiring (refer to FIG. 2C).

Figure 2D:
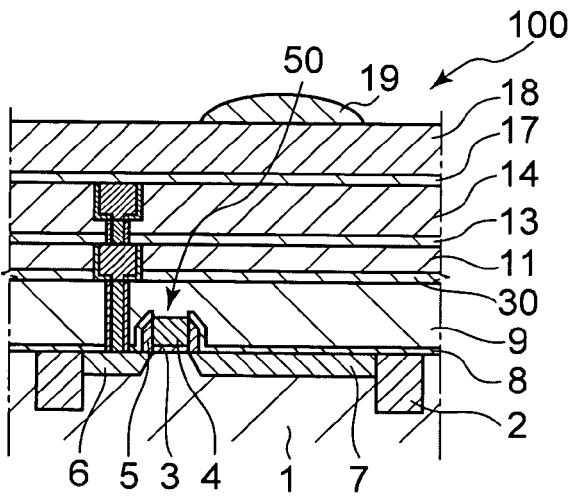

After that, the color resist 18 and the on-chip lens 19 are formed thereon, and thus the above-mentioned CMOS solid-state imaging device can be obtained (see FIG. 2D).

In the present embodiment, although the first diffusion protection film is formed after the first connection section is formed in the interlayer insulation film, the first connection section may be formed after the first diffusion protection film is formed on the interlayer insulation film.

In the present embodiment, although a silicon nitride film is employed as the first diffusion protection film, it is not necessary to be a silicon nitride film but any film capable of suppressing diffusion of potassium into a silicon substrate side, and may be, for example, silicon carbide and the like.

As to the CMOS solid-state imaging device shown in FIG. 1, if there is a concern that deterioration of the light receiving efficiency to the photoelectric conversion element may occur due to attenuation and interference of light because layers each having different reflection indexes and absorption indexes are stacked on the light receiving section 7, another CMOS solid-state imaging device may be employed, in which the second diffusion protection film and the third diffusion protection film are opened at a predetermined range on the upper region of the photoelectric conversion element.

Figure 3A:
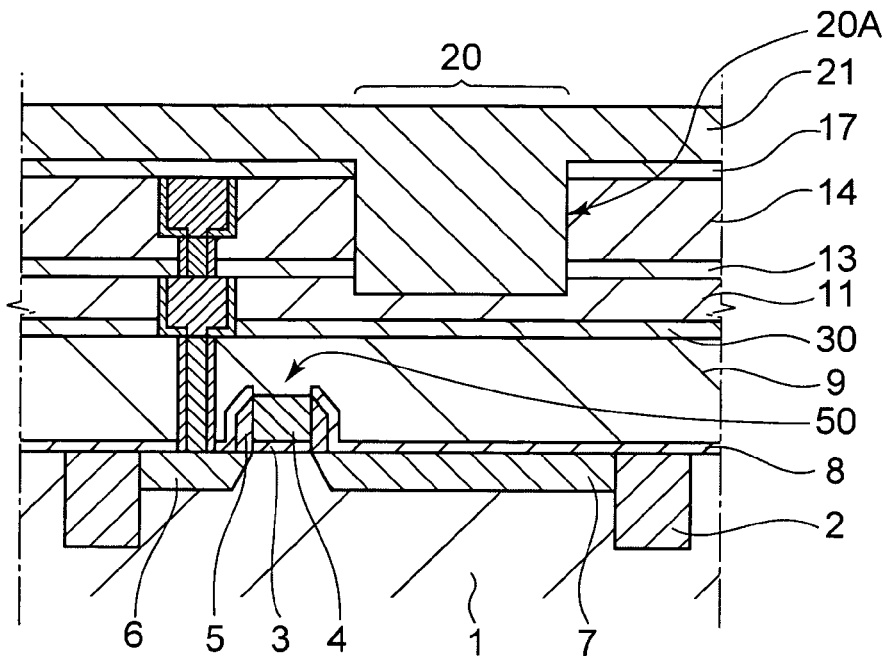
FIGS. 3A to 3B are schematic cross-sectional views of a modified example 1 of a method of manufacturing a solid-state imaging device to which an embodiment of the present invention is applied.
Figure 3B:
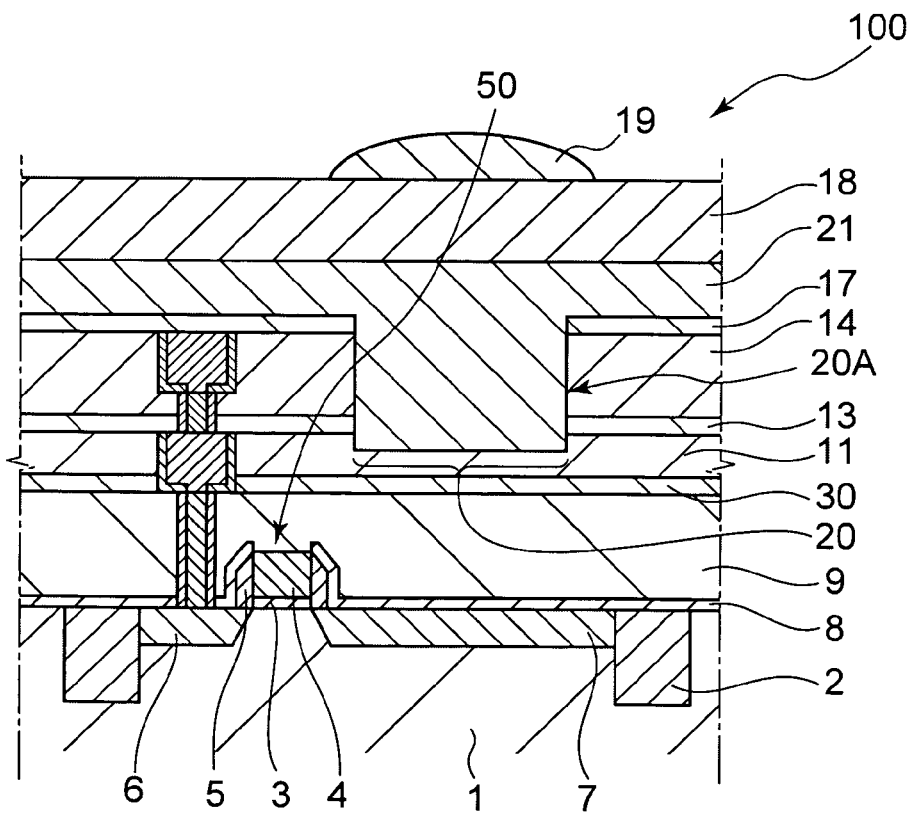

A first specific method of manufacturing the CMOS solid-state imaging device is described below, in which the second diffusion protection film and the third diffusion protection film are opened at a predetermined range on the upper region of the photoelectric conversion element. After the third diffusion protection film 17 is formed to protect the copper wiring of the second wiring layer 16 as shown in FIG. 2C, the light receiving region of the photoelectric conversion element is opened by general-purpose photography and etching to form an opening region 20A. The opening region 20A is filled with a CVD oxide film 21, the surplus CVD oxide film 21 is removed by the CMP to form an opening 20 above the light receiving section of the photoelectric conversion element (refer to FIG. 3A). After that, the color resist 18 and the on-chip lens 19 are formed thereon, and thus the CMOS solid-state imaging device is obtained, in which the second diffusion protection film and the third diffusion protection film are opened at a predetermined range on the upper region of the photoelectric conversion element (refer to FIG. 3B).

Figure 4A:
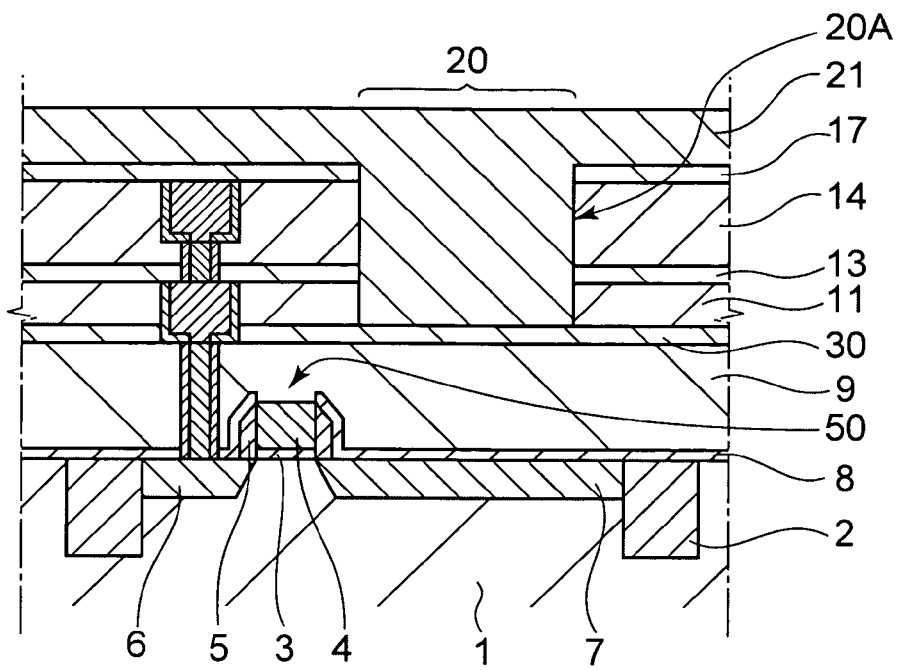
FIGS. 4A to 4B are schematic cross-sectional views of a modified example 2 of a method of manufacturing a solid-state imaging device to which an embodiment of the present invention is applied.
Figure 4B:
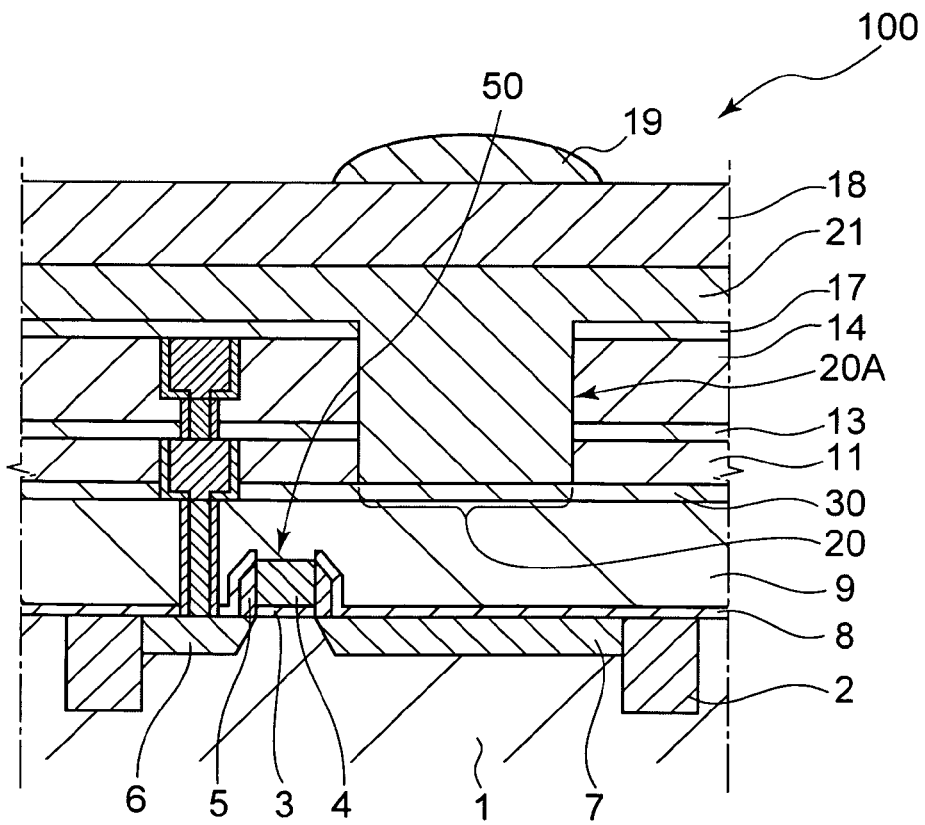
Figure 5A:
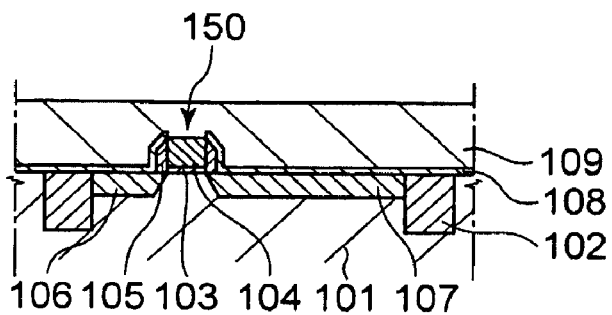
FIGS. 5A to 5D are schematic cross-sectional views illustrating a method of manufacturing a CMOS solid-state imaging device in a related art.
Figure 5B:
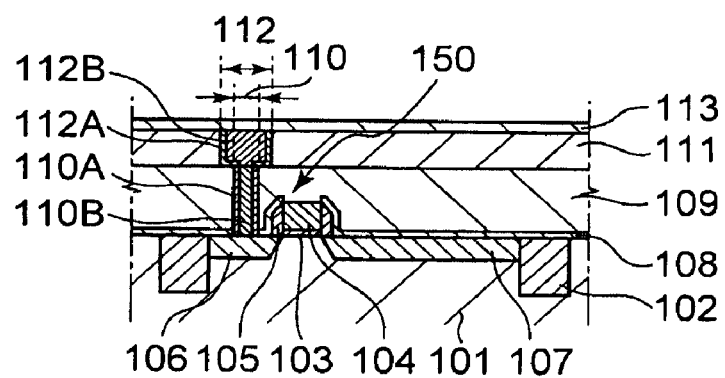
Figure 5C:
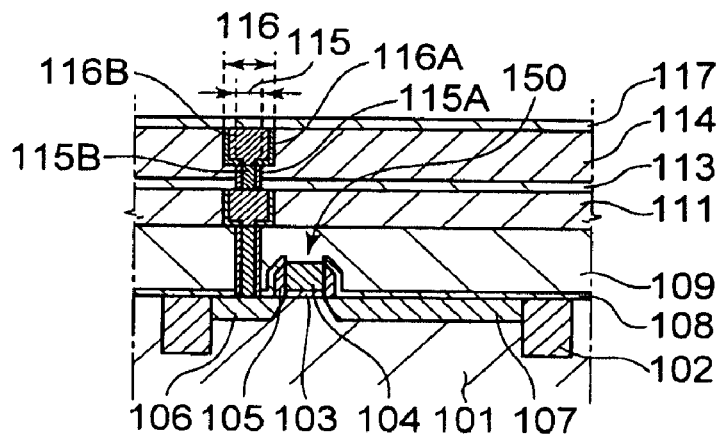
Figure 5D:
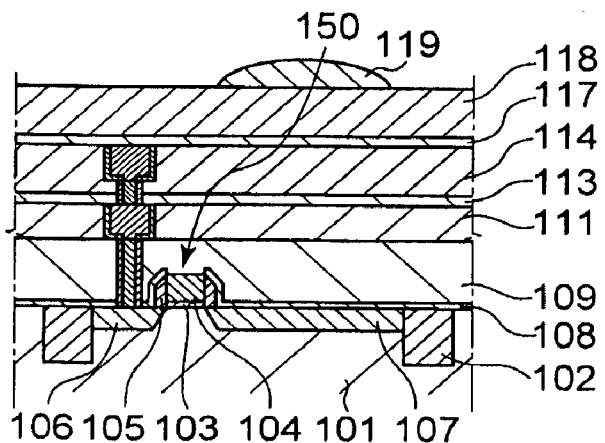
Figure 6A:
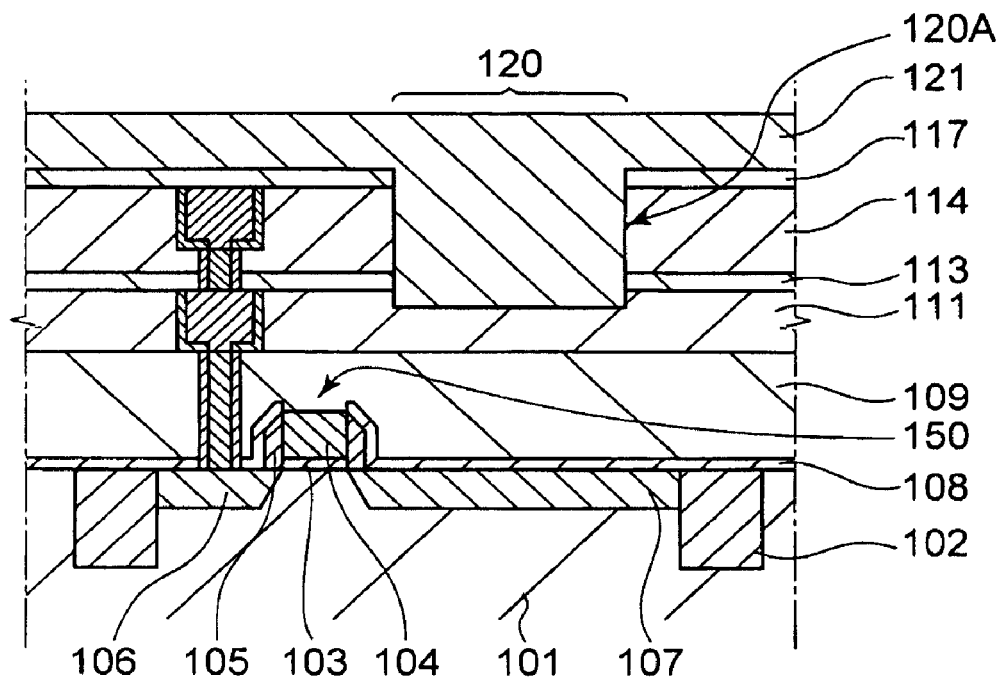
FIGS. 6A to 6B are schematic cross-sectional views illustrating a modified example of a method of manufacturing a solid-state imaging device in a related art.
Figure 6B:
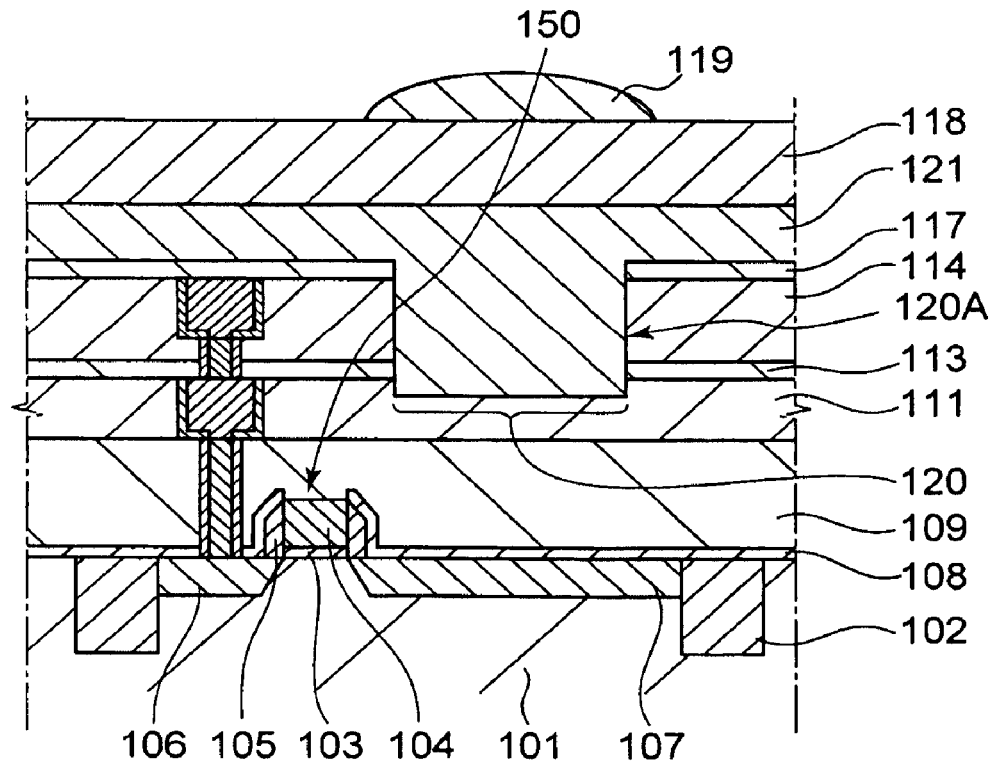

A second specific method of manufacturing the CMOS solid-state imaging device is described below, in which the second diffusion protection film and the third diffusion protection film are opened at a predetermined range on the upper region of the photoelectric conversion element. After the third diffusion protection film 17 is formed to protect the copper wiring of the second wiring layer 16 as shown in FIG. 2C, a region of the light receiving section of the photoelectric conversion element is opened by general-purpose photography and etching to form the opening region 20A. At this time, the first diffusion protection film 30 is used as an etching stopper film and the second and third diffusion protection films 13 and 17 and the first and second interlayer insulation films 11 and 14 are etched with an etching condition of a higher selectivity than that for the first diffusion protection film 30, so that a desired thickness of the first diffusion protection film 30 remains. The opening 20A is filled with the CVD oxide film 21 and the surplus CVD oxide film 21 is removed by the CMP to form the opening 20 above the light receiving section of the light photoelectric conversion element (refer to FIG. 4A). After that, the color resist 18 and the on-chip lens 19 are formed thereon, and thus the CMOS solid-state imaging device is obtained, in which the second and third diffusion protection films are opened at a predetermined range on the upper region of the photoelectric conversion element (refer to FIG. 4B).

In the above-mentioned CMOS solid-state imaging device to which the embodiment of the present invention is applied, the influence of potassium contained in the slurry used as polishing agent during the CMP is suppressed by the first diffusion protection film, thereby enabling the suppression of deterioration of the image quality such as white spots or the like.

Further, in the above-mentioned CMOS solid-state imaging device, by arranging materials and thickness of the first diffusion protection film, an amount of entering light and an amount of entering light depending on wavelength can be adjusted and imaging characteristics such as sensitivity can be supported.

It is to be noted that, by opening the second and third diffusion protection films at a predetermined range on the upper region of the photoelectric conversion element, even if materials each having different refractive indexes and absorption indexes for the transmitted light are used for the diffusion protection film (the second and third diffusion protection films) to protect diffusion from materials of the wiring, light can preferably enter the light receiving section, and deterioration of the light receiving efficiency due to light attenuation and interference of light can be suppressed.

It should be understood by those skilled in the art that various modifications, combinations, sub-combinations and alterations may occur depending on design requirements and other factors insofar as they are within the scope of the appended claims or the equivalents thereof.

The present invention contains subject matter related to Japanese Patent Application JP2005-002772, filed in the Japanese Patent Office on Jan. 7, 2005, the entire contents of which being incorporated herein by reference.

What is claimed is:

1. A solid-state imaging device, comprising:
   a semiconductor substrate with an imaging region having a light receiving section;
   a dielectric film formed on the semiconductor substrate having a portion that covers the light receiving section;
   an interlayer insulation film formed on the dielectric film;
   a first diffusion protection film formed on a surface of the interlayer insulation film facing away from the substrate and covering at least the light receiving section, the first diffusion protection film having a first wiring groove therein filled with a metal element;
   a first inter-wiring insulation film formed on the first diffusion protection film;
   a second diffusion protection film formed on a surface of the first inter-wiring insulation film facing away from the semiconductor substrate;
   a second inter-wiring insulation film formed on the second diffusion protection film;
   an opening over the light receiving section and which extends through the second inter-wiring insulation film, the second diffusion protection film, and the first inter-wiring insulation film, but not through the first diffusion protection film; and
   a lens aligned with the opening.

2. The solid-state imaging device according to claim 1, wherein the first diffusion protection film is made of silicon carbide or silicon nitride.

3. The solid-state imaging device according to claim 1, further comprising:
   a third diffusion protection film formed on the second inter-wiring insulation film,
   wherein the opening also extends through the third diffusion protection film.

4. The solid-state imaging device according to claim 1 wherein all light received by the light receiving section must pass through the first diffusion protection film.

5. The solid-state imaging device according to claim 1, further comprising:
   a third diffusion protection film directly adjacent to the opening and on the dielectric film.

6. The solid-state imaging device according to claim 1, wherein the first diffusion protection film is formed directly on the interlayer insulation film and abuts the interlayer insulation film along an entire length of the interlayer insulation film.

7. The solid-state imaging device according to claim 1, wherein the opening begins at a third diffusion protection film, extends through the second diffusion protection film, and stops at the first diffusion protection film.

8. The solid-state imaging device according to claim 1, wherein the first diffusion protection film extends along a single plane.

9. The solid-state imaging device according to claim 1, further comprising a third diffusion protection film on the second inter-wiring insulation film, wherein the opening begins at the third diffusion protection film, extends through the second diffusion protection film, and stops at the first diffusion protection film such that the opening directly abuts (i) the first diffusion protection film, (ii) the first inter-wiring insulation film, (iii) the second diffusion protection film, and (iv) the second inter-wiring insulation film.

10. The solid-state imaging device according to claim 1, wherein the light receiving section includes sidewalls with a gate electrode formed therebetween.

11. The solid-state imaging device according to claim 10, wherein the dielectric film runs along the sidewalls of the light receiving section and includes an angled portion that is angled toward a light receiving section opening.

12. The solid-state imaging device according to claim 1, wherein the dielectric film is a silicon nitride film.

13. The solid-state imaging device according to claim 1, further comprising:
an oxide film within the opening.

14. A solid-state imaging device, comprising:
a semiconductor substrate with an imaging region having a light receiving section;
a dielectric film formed directly on the semiconductor substrate and having a connection section therein that is horizontally offset from the light receiving section;
an interlayer insulation film formed directly on the dielectric film;
a diffusion protection film formed in a surface of the interlayer insulation film facing away from the substrate and extending along a single plane on the interlayer insulation film, the diffusion protection film substantially isolating the dielectric film in one direction;
an opening over the light receiving section which abuts the diffusion protection film; and
a lens aligned with the opening.

15. The solid-state imaging device according to claim 14 wherein, the diffusion protection film is formed directly on the surface of the interlayer insulation film.

16. The solid-state imaging device according to claim 14, wherein the opening is formed aligned with the lens.

17. The solid-state imaging device according to claim 14, wherein a bottom surface of the opening abuts the diffusion protection film.

18. The solid-state imaging device according to claim 14, wherein the opening comprising a plurality of layers on the diffusion protection film, the opening extending through the plurality of layers.

19. The solid-state imaging device according to claim 14, wherein the dielectric film is a silicon nitride film.

* * * * *